(12) United States Patent
Merritt et al.

(10) Patent No.: US 7,006,393 B2
(45) Date of Patent: Feb. 28, 2006

(54) METHOD AND APPARATUS FOR SEMICONDUCTOR DEVICE REPAIR WITH REDUCED NUMBER OF PROGRAMMABLE ELEMENTS

(75) Inventors: Todd A. Merritt, Boise, ID (US);
Timothy B. Cowles, Boise, ID (US);
Vikram K. Bollu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/862,284

(22) Filed: Jun. 7, 2004

(65) Prior Publication Data

US 2005/0270841 A1 Dec. 8, 2005

(51) Int. Cl.
*G11C 7/00* (2006.01)

(52) U.S. Cl. .................................. 365/200; 365/189.07
(58) Field of Classification Search ...................... None
See application file for complete search history.

(56) References Cited

U.S. PATENT DOCUMENTS

| | | | |
|---|---|---|---|
| 5,387,823 A | 2/1995 | Asnizawa | |
| 5,572,470 A | 11/1996 | McClure et al. | |
| 5,691,945 A * | 11/1997 | Liou et al. | 365/200 |
| 5,708,619 A | 1/1998 | Gillingham | |
| 5,841,712 A | 11/1998 | Wendell et al. | |
| 5,883,842 A * | 3/1999 | Miyauchi | 365/200 |
| 5,920,516 A | 7/1999 | Gilliam et al. | |
| 6,240,033 B1 | 5/2001 | Yang et al. | |
| 6,285,603 B1 | 9/2001 | Ku et al. | |
| 6,480,429 B1 * | 11/2002 | Jones et al. | 365/200 |
| 6,538,934 B1 * | 3/2003 | Sakata | 365/200 |
| 6,574,156 B1 | 6/2003 | Waller et al. | |

\* cited by examiner

*Primary Examiner*—Son Mai
(74) *Attorney, Agent, or Firm*—TraskBritt

(57) ABSTRACT

An apparatus and method using a reduced number of fuses for enabling redundant memory blocks in a semiconductor memory is disclosed. In one embodiment, a redundancy selection module may be configured using selection fuses, wherein each selection fuse selects a pair of repair modules. In another embodiment, a redundancy selection module may be configured using selection fuses, wherein each selection fuse may select a power of two (i.e., 1, 2, 4, 8, etc.) number of repair modules. Each repair module includes fuses programmed with a selected address, such that the repair module may respond when an address input matches the selected address. However, the Least Significant Bit (LSB) is uninvolved in the address programming. Instead, the LSB is compared to the values of the selection fuses. As a result, repair modules select a redundant memory block based on a combination of the selected address comparison and the separate LSB comparison.

31 Claims, 4 Drawing Sheets

METHOD AND APPARATUS FOR SEMICONDUCTOR DEVICE REPAIR WITH REDUCED NUMBER OF PROGRAMMABLE ELEMENTS

CROSS REFERENCE TO RELATED APPLICATIONS

The present application is related to a concurrently filed application 10/862,532.

BACKGROUND OF THE INVENTION

1. Field of the Invention

This invention relates generally to semiconductor memory circuits, and particularly to circuits and methods for repairing semiconductor memory circuits having redundant memory cells.

2. Description of Related Art

Semiconductor memories generally include a multitude of memory cells arranged in rows and columns. Each memory cell is structured for storing digital information in the form of a "1" or a "0" bit. Many semiconductor memories include extra, i.e., redundant, memory cells that may be substituted for failing memory cells. Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or redundant columns in the semiconductor memory array.

Conventionally, when a redundant row is used to repair a semiconductor memory containing a failing memory cell, the failing cell's row address is permanently stored (typically in pre-decoded form) by programming nonvolatile elements (e.g., fuses, antifuses, Electrically Programmable Read-Only memory (EPROM), and FLASH memory cells) on the semiconductor memory. Then, during normal operation of the semiconductor memory, if the memory's addressing circuitry receives a memory address including a row address that corresponds to the row address stored on the chip, redundant circuitry in the memory causes access to a redundant row instead of the row identified by the received memory address. Since every memory cell in the failing cell's row has the same row address, the redundant row replaces every cell in the failing cell's row, both operative and failing, with the redundant memory cells in the redundant row.

Similarly, when a redundant column is used to repair the semiconductor memory, the failing cell's column address is permanently stored (typically in pre-decoded form) on the chip by programming nonvolatile elements on the chip. Then, during normal operation of the semiconductor memory, if the memory's addressing circuitry receives a memory address, including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column. This process for repairing a semiconductor memory using redundant rows and columns is well known in the art.

A typical semiconductor memory may have many redundant rows and many redundant columns, each redundant block (whether for a row or column) including its own nonvolatile programming elements for enabling and programming the address to which it will respond. As feature sizes on semiconductor devices continue to shrink, the density of memory cells on a semiconductor die continues to increase, allowing more memory cells on a semiconductor die, which in turn require more redundant rows and columns to repair the increased number of memory cells. Because of an increased number of redundant rows and columns, an increased number of nonvolatile elements are required to select each redundant row and each redundant column. Unfortunately, sizes for nonvolatile programming elements have not reduced proportionately to size reduction for memory cells. As a result, the nonvolatile programming elements take up a larger portion of the available semiconductor die area. In some designs, the nonvolatile programming elements may take up as much as five to ten percent of the overall semiconductor die area.

It would be advantageous to provide an apparatus and method using a reduced number of nonvolatile programming elements associated with repairing a semiconductor device, without compromising overall ability to perform repairs or impact operational speed while reducing area requirements for supporting selection of redundant rows and redundant columns on a semiconductor memory device. Further, it would be advantageous to reduce power use and reduce loading on address signals used to select redundant rows and columns.

BRIEF SUMMARY OF THE INVENTION

One embodiment of the present reduced fuse architecture comprises a semiconductor memory, including a plurality of redundant memory blocks and at least one redundancy selection module. Each redundancy selection module comprises a plurality of repair modules for selecting the plurality of memory blocks, and a plurality of group selectors. The redundancy selection modules may be configured to generate selection input signals for selecting each of the redundant rows and redundant columns when needed to replace a normal memory row or a normal memory column, respectively.

Each repair module contains nonvolatile address elements, which may be programmed with a selected address for that repair module such that the repair module may respond when an address input matches the selected address. However, one address bit is removed from the programming to be defined as a shared address bit. The use of a shared address bit results in a reduction in the number of required nonvolatile programming elements without reducing overall repairability. This shared address bit does not have a corresponding nonvolatile address element within the repair module for comparison. Instead, the shared address bit may be compared to a nonvolatile selection element within a group selector. The nonvolatile selection element within each group selector may be programmed to generate a selection input signal when the shared address bit is asserted or left unprogrammed to generate a selection input signal when the shared address bit is de-asserted. The selection input signals generated by the plurality of group selectors connect to various repair modules such that a match output from a repair module may be generated to select a redundant memory block when the selection input to that repair module is asserted and an address input matches the selected address programmed in that repair module. Each repair module may also contain a nonvolatile enable element for enabling that repair module. Additionally, each repair module may also contain a nonvolatile disable element for overriding any programming of the nonvolatile address elements and nonvolatile enable element in that repair module.

In one exemplary embodiment, which may be referred to as the pairs embodiment, each redundancy selection module may be configured using N nonvolatile selection elements to configure and assert selection inputs to a total of 2*N repair modules. Each group selector, containing one nonvolatile selection element, connects to the selection input of two repair modules.

As an example, assume A0 is used as the shared address bit. Any given group selector may be programmed to generate a selection input when A0 is de-asserted (i.e., an even address). The two repair modules connected to that given group selector might be programmed to different selected addresses resulting in two repair modules that respond to different even addresses. Another group selector may be programmed to generate a selection input when A0 is asserted (i.e., an odd address). The two repair modules connected to this other group selector may be programmed to different selected addresses resulting in two repair modules that respond to different odd addresses.

As described above, the pairs embodiment may not be able to achieve full use of all redundant memory blocks if an odd number of even addresses and an odd number of odd addresses are required. To deal with these odd numbers, the pairs embodiment may include a first additional group selector for selecting an even address (i.e., A0 is de-asserted) in a first additional repair module, and second additional group selector for selecting an odd address (i.e., A0 is asserted) in a second additional repair module.

In another exemplary embodiment, which may be referred to as the binary embodiment, each redundancy selection module may be configured using M nonvolatile selection elements to configure and assert selection inputs to $2^M-1$ repair modules. Each group selector is consecutively numbered with a number (N) from zero to M. Each group selector, containing one nonvolatile selection element, connects to the selection input of $2^N$ repair modules.

As an example, assume A0 is used as the shared address bit. A group selector connected to eight (i.e., $2^3$) repair modules may be programmed to generate a selection input when A0 is de-asserted (i.e., an even address). These eight repair modules may be programmed to different selected addresses resulting in eight repair modules that respond to different even addresses. Another group selector connected to four (i.e., $2^2$) repair modules may be programmed to generate a selection input when A0 is asserted (i.e., an odd address). These four repair modules may be programmed to different selected addresses resulting in four repair modules that respond to different odd addresses.

As described above, the binary embodiment selects $2^M-1$ repair modules. This may not deal with the case where the number of redundant memory blocks and corresponding repair modules are configured in a typical binary power (i.e., 2, 4, 8, 16, etc.). If needed, to create $2^M$ repair modules, the binary embodiment may include a first additional group selector for selecting a first additional repair module.

Another embodiment of the present invention includes a plurality of semiconductor memories incorporating the reduced fuse architecture described herein fabricated on a semiconductor wafer.

Another embodiment, in accordance with the present invention comprises an electronic system comprising an input device, an output device, a processor, and a memory device. The memory device comprises at least one semiconductor memory incorporating the reduced fuse architecture described herein.

BRIEF DESCRIPTION OF THE DRAWINGS

In the drawings, which illustrate what is currently considered to be the best mode for carrying out the invention.

DETAILED DESCRIPTION OF THE INVENTION

In the following description, numerous specific details are set forth, such as specific word or byte lengths, etc., to provide a thorough understanding of the present invention. However, it will be obvious to those skilled in the art that the present invention may be practiced without such specific, but exemplary, details. In other instances, circuits have been shown in block diagram form in order not to obscure the present invention in unnecessary detail. Additionally, block definitions and partitioning of logic between various blocks is exemplary of a specific implementation. It will be obvious to one of ordinary skill in the art that the present invention may be practiced by numerous other partitioning solutions. For the most part, details concerning timing considerations and the like have been omitted inasmuch as such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal. The terms "assert" and "negate" are respectively used when referring to the rendering of a signal, status bit, or similar apparatus into its logically true or logically false state. If the logically true state is a logic level one, the logically false state will be a logic level zero. Conversely, if the logically true state is a logic level zero, the logically false state will be a logic level one.

Different types of nonvolatile programming elements may be used to implement the present invention, such as fuses, anti-fuses, laser fuses, Flash memory cells, and EPROM cells. These nonvolatile programming elements may be used for various functions within the design. For ease of description and clarity, the nonvolatile programming elements may be referred to by various names, such as nonvolatile selection element 219, nonvolatile address element 312, nonvolatile enable element 332, and nonvolatile disable element 334. Additionally, unless specified otherwise, the nonvolatile programming elements are assumed to produce a logic "1" as an asserted level when programmed and a logic "0" as a de-asserted level when left un-programmed.

Figure 1:
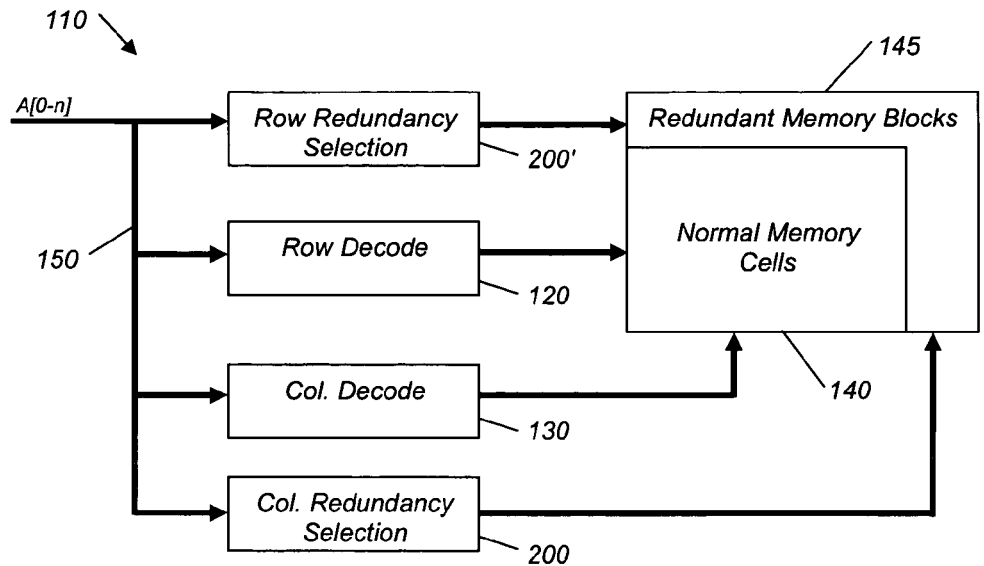
FIG. 1 is a block diagram of an exemplary memory bank in a semiconductor memory showing redundancy selection modules for selecting redundant memory blocks rather than normal memory cells.

FIG. 1 is a block diagram of an exemplary memory bank 110 in a semiconductor memory 100 (not shown) in accordance with an embodiment of the present invention. A row decode module 120 accepts address inputs 150 for decoding into select signals for each row within a normal memory cell array 140. Similarly, a column decode module 130 accepts an address input 150 for decoding into select signals for each column within the normal memory cell array 140. At least one row redundancy selection module 200 accepts address inputs 150 for decoding and comparing to selected address 315 (shown in FIG. 4) values, such that select signals may be generated for each redundant row within the redundant memory cell array. Similarly, at least one column redundancy selection module 200 accepts address inputs 150 for decoding and comparing to selected address 315 values such that select signals may be generated for each redundant column within the redundant memory cell array. Redundant rows and redundant columns are also referred to herein generically as redundant memory blocks 145.

The block diagram shown in FIG. 1 is illustrative of a single memory bank 110. Many modern semiconductor memories are physically organized essentially as a plurality of memory banks 110 organized as a square or rectangle of memory bits such that multiple bits are addressed for each memory address comprised of a combined row and column address. The number of bits addressed with each memory address may vary, with exemplary amounts being 4, 8, and 16 bits per memory address. As an example memory architecture, a 512 Mbit DRAM may be separated into four banks, each bank containing 128 Mbits. Each bank may typically be configured as 8K rows. Each bank may typically comprise 16K columns, which may be organized as 4K columns of four bits, 2K columns of eight bits, or 1K columns of 16 bits. Typical memory addressing is well known to those skilled in the art, therefore, it is not described in detail herein. Additionally, the arrays of normal memory cells and redundant memory blocks 145 may be segmented into smaller portions to aid in address decoding.

Figure 2:
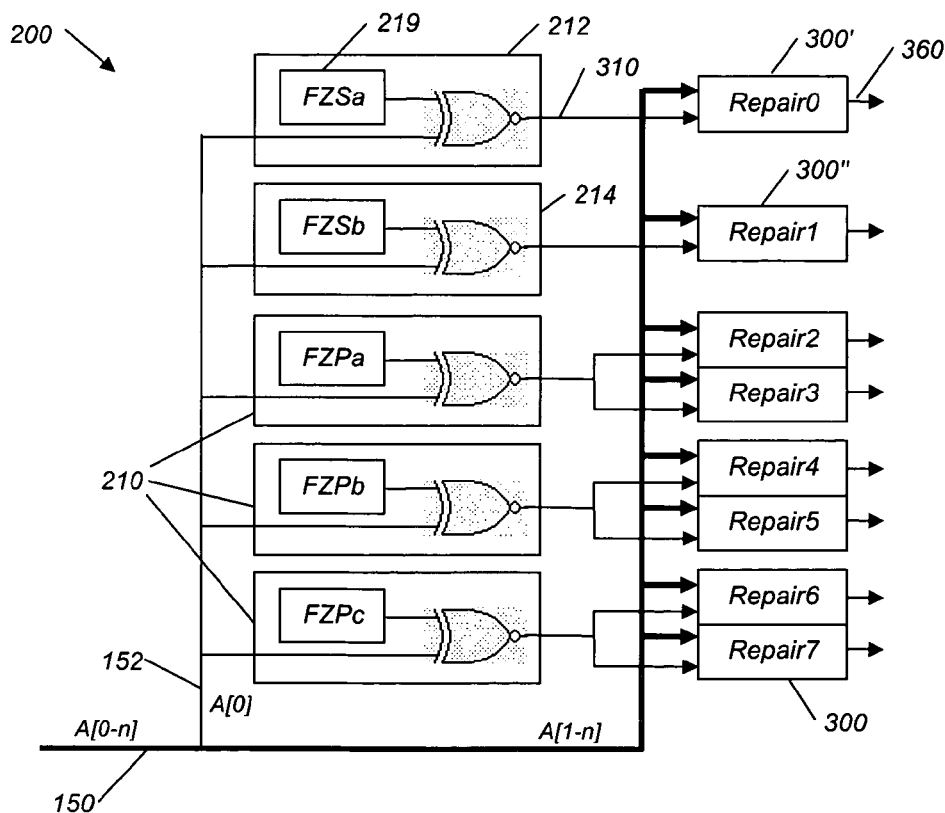
FIG. 2 is a block diagram of an exemplary redundancy selection module using nonvolatile selection elements.

FIG. 2 is an exemplary embodiment of a redundancy selection module 200 used to select a set of redundant memory blocks 145. Redundancy selection modules for rows and column are typically similar. Therefore, the description of redundancy selection modules 200 applies to both redundant rows and redundant columns unless specified differently herein. Each redundancy selection module 200 comprises a plurality of repair modules 300 and a plurality of group selectors 210. An address input 150 bus connects to the repair modules 300. The address input 150 bus may represent all or portions of a row address or a column address. At least one of the address bits is designated as a shared address bit 152, which need not be connected to the repair modules 300. The shared address bit 152 may instead connect to the group selectors 210. In the embodiment shown in FIG. 2, the shared address bit 152 is defined as A0. However, any of the bits within the address bus may be used as the shared address bit 152. In fact, it may be advantageous to use a different address bit as the shared address bit 152 within each redundancy selection module 200. There is reduced loading on the shared address bit 152 for the same reasons discussed for the reduction in number of nonvolatile elements, namely, the shared address bit 152 connects to fewer number of group selectors 210 relative to connecting to every repair module 300. Reduced loading may typically increase signal speed. By using different address bits for different redundant memory blocks 145 it may be possible to increase the overall speed of the entire address input 150 bus.

Figure 4:
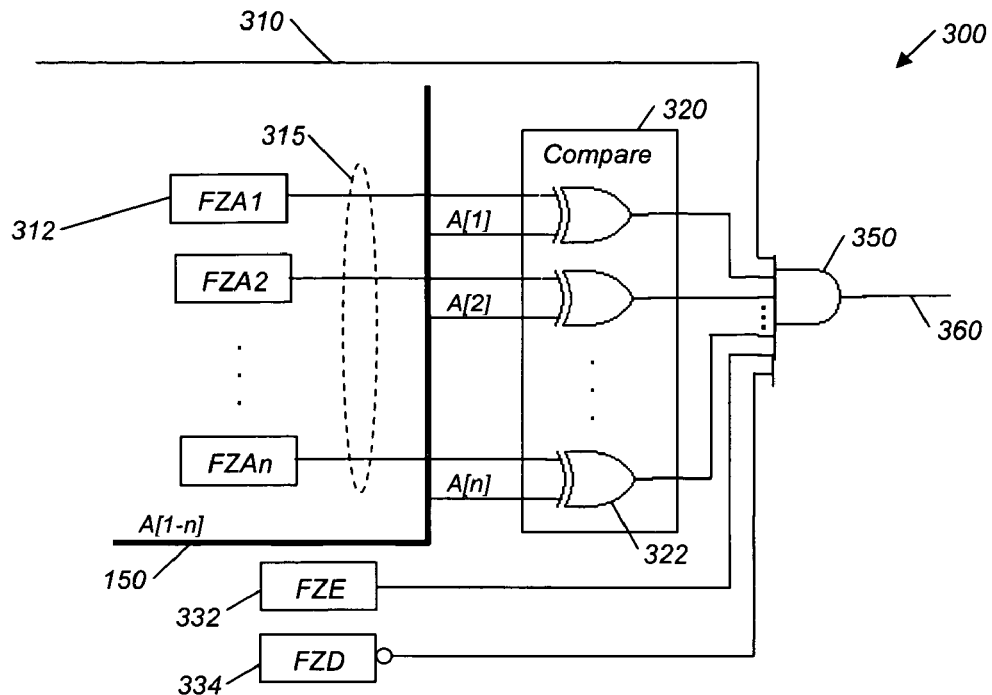
FIG. 4 is a block diagram of another exemplary redundancy selection module using nonvolatile enable elements.

Each repair module 300, as shown in FIG. 4, includes a match output 360, which may be used to select the redundant memory block 145 corresponding to that repair module 300 in place of the normal memory block containing the faulty memory cell. Additionally, each repair module 300 comprises a set of nonvolatile address elements 312 for programming a selected address 315, an address comparator 320, a selection input 310, a combination element 350, a nonvolatile enable element 332, and an optional nonvolatile disable element 334. The address comparator 320 uses individual address bit comparators 322 to compare the address input 150 bus to the selected address 315 programmed into the nonvolatile address elements 312 FZA1 through FZAn. The bit widths of the address input 150 bus, the nonvolatile address elements 312, and the address bit comparators 322 may vary with repair modules 300 in different memory architectures, repair modules 300 for redundant rows, and repair modules 300 for redundant columns.

In some other embodiments, each repair module 300 may have a nonvolatile disable element 334 used to disable a redundant memory block 145 (not shown). The disable function may be needed in a case where a redundant memory block 145 contains a faulty memory bit and should therefore be disabled from use as a redundant memory block 145. In addition, the disable function may be needed if a fault or error occurs in the attempt to program a repair module 300. For any given repair module 300, the disable function may override any other nonvolatile element programming within that repair module 300.

A nonvolatile enable element 332 within the repair module 300 may be used to control enabling of the repair module 300 if the redundant memory block 145 connected to the repair module 300 is needed. If the nonvolatile enable element 332 is left unprogrammed, the repair module 300 is disabled such that a match output 360 may not be asserted. If the nonvolatile enable element 332 is programmed, the combination element 350 may assert the match output 360 when combined with a matching result from the address comparator 320 and an asserted level on the select signal. When asserted, the match output 360 may select the redundant memory block 145 for operation. In some memory architectures, the match output 360 may be used to select the redundant memory block 145 and deselect the defective memory block. In other architectures, the defective memory block may be independently disabled. Note that the combination element 350 is shown as a multi-input AND gate and the compare functions as EXCLUSIVE-OR gates to show logical function only, not physical implementation. The combination and compare functions may be implemented in many bit widths as well as physical configurations such as, for example, cascaded logic gates, pre-charge and evaluate type implementations, and pre-charge domino type implementations.

Within the redundancy selection module 200, as shown in FIG. 2, group selectors 210 connect to the selection input 310 of the repair modules 300. The nonvolatile selection elements 219 within the group selectors 210 may be programmed to assert the select signal when the shared address bit 152 is asserted by connecting to the EXCLUSIVE-NOR logic function within the group selector 210. Alternatively, the nonvolatile selection elements 219 within the group selectors 210 may be programmed to assert the select signal when the shared address bit 152 is de-asserted by connecting to an EXCLUSIVE-OR logic function (not shown) rather than the EXCLUSIVE-NOR logic function. Once again, the logic symbols are intended to show a logical function only and not a specific implementation.

In the FIG. 2 embodiment of a redundancy selection module 200, a first additional group selector 212 connects to a first additional repair module 300', and a second additional group selector 214 connects to a second additional repair module 300". All other group selectors 210 connect to a pair of repair modules 300. This pairing approach is where the savings in number of nonvolatile programming elements is achieved. In a typical prior art implementation, each repair module 300 would contain a nonvolatile programming element for the shared address bit 152. In the FIG. 2 embodiment of the present invention, the nonvolatile selection element 219 for controlling the shared address bit 152 is shared between a pair of repair modules 300. For the example shown in FIG. 2 with eight repair modules 300, eight nonvolatile programming elements are saved, one in each repair module 300 and five nonvolatile selection elements 219 are added for the shared address bit 152, resulting in a net savings of three nonvolatile programming elements for each redundancy selection module 200. The exemplary embodiment of a redundancy selection module 200, shown in FIG. 2 may also be referred to as a pairs redundancy selection module 200.

If an odd number of repair modules 300 e.g., seven rather than eight) are used within a redundancy selection module 200, only one first additional group selector 212 connected to a first additional repair module 300' may be used. However, when an even number of repair modules are used, using first and second additional group selectors (212 and 214) connected to first and second repair modules (300' and 300") may typically be used to maintain full reparability for any combination of possible addresses requiring repair. If the statistical possibility of one repair module 300 within a redundancy selection module 200 being unusable is acceptable, the two additional group selectors (212 and 214) connected to single repair modules (300' and 300") may be eliminated in favor of a group selector 210 connected to a pair of repair modules 300, saving an additional nonvolatile programming element. This loss of reparability is explained more fully below.

FIG. 2 is an exemplary embodiment of a redundancy selection module 200 using eight repair modules 300. However, other numbers are clearly within the scope of this invention, such as, for example only, 16 or 32 repair modules 300 per redundancy selection module 200.

Figure 3:
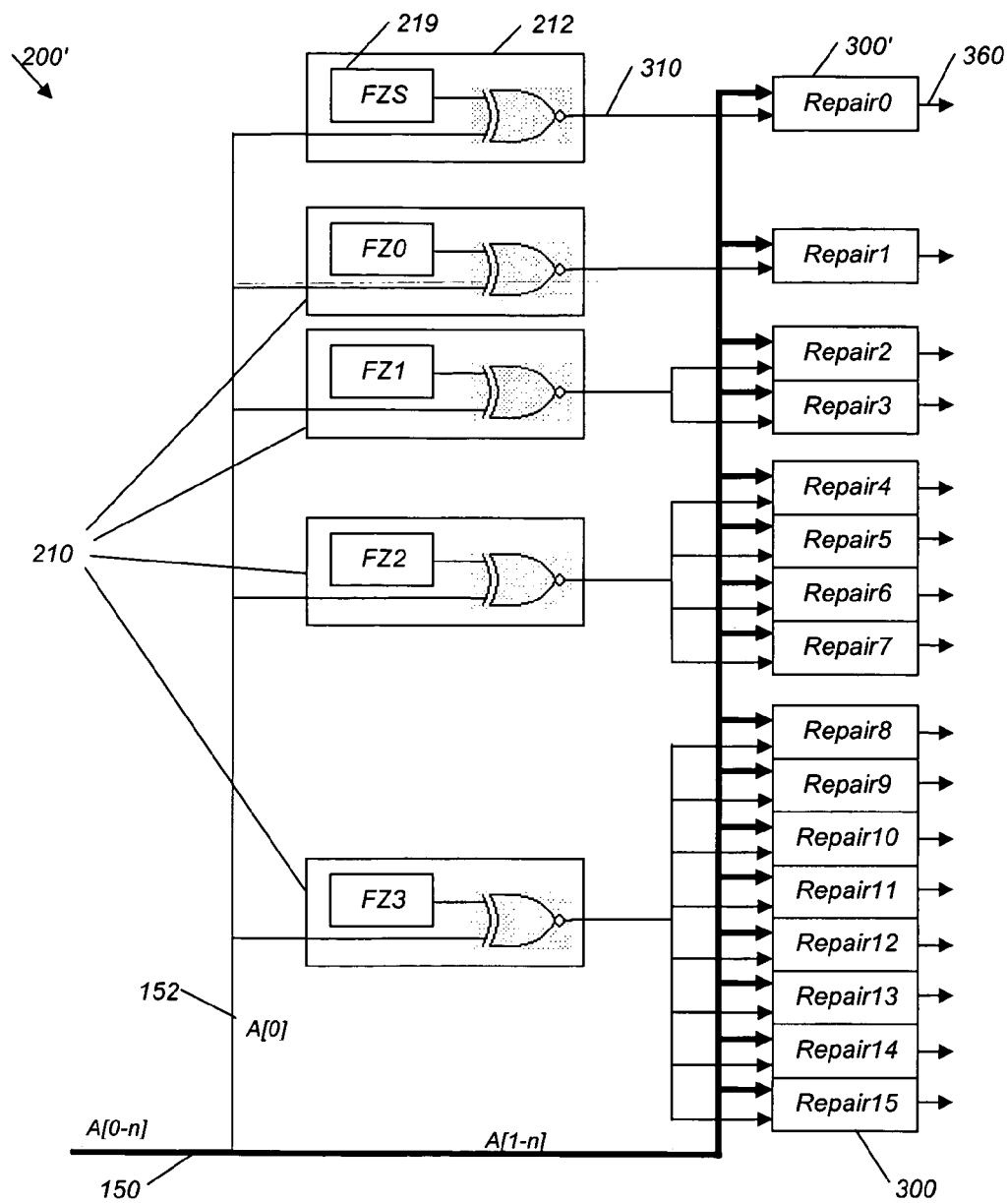
FIG. 3 is a block diagram of an exemplary repair module.

In the FIG. 3 embodiment of a redundancy selection module 200', the group selectors 210 connect to a varying number of repair modules 300. The variation occurs as a binary sequence. In other words, if the group selectors 210 are considered numbered (with a number N) in a sequence from zero to a maximum number (M), each group selector 210 connects to $2^N$ repair modules 300. This group selector 210 configuration allows for control of $2^{M+}-1$ (i.e., 1, 3, 7, 15, 31, etc.) repair modules 300. Typically, repair modules 300 may be placed in powers of two (i.e., 2, 4, 8, 16, 32, etc.). If needed, a first additional group selector 212 connecting to a single additional repair module 300 may be added to complete control of $2^{M+1}$ repair modules 300.

As an example, the FIG. 3 embodiment shows four sequentially numbered group selectors 210 designated by numbering the nonvolatile selection elements 219 as FZ0 through FZ3. For this example M=3 resulting in a possible control of $2^{3+1}-1=15$ repair modules 300 controlled by the group selectors 210. An additional group selector 212 is added resulting in control of a total of 16 repair modules 300. Group selector 0 connects to one (i.e., $2^0$) repair module 300. Group selector 1 connects to two (i.e., $2^1$) repair modules 300. Group selector 2 connects to four (i.e., $2^2$) repair modules 300. Finally, Group selector 3 connects to eight (i.e., $2^3$) repair modules 300. For the example shown in FIG. 3 with 16 repair modules 300, 16 nonvolatile programming elements are saved, one in each repair module 300, and five nonvolatile selection elements 219 are added in the group selectors 210 for the shared address bit 152 comparison, resulting in a net savings of 11 nonvolatile programming elements for each redundancy selection module 200'. This exemplary embodiment of a redundancy selection module 200' shown in FIG. 3 may also be referred to as a binary power redundancy selection module 200'.

FIG. 3 is an exemplary embodiment of a redundancy selection module 200' using 16 repair modules 300. Other numbers are clearly within the scope of this invention, such as, for example, 8 or 32 repair modules 300 per redundancy selection module 200'.

To configure each redundancy selection module (200 or 200) for operation, the nonvolatile address elements 312 (shown in FIG. 4) (FZA1–FZAN) in each repair module 300 may be programmed to a unique selected address 315 representing the address of a defective normal memory block. For each repair module 300 intended to select a redundant memory block 145 as a replacement for a defective memory block, the nonvolatile enable element 332 for that repair module 300 may also be programmed. Additionally, for the entire redundancy selection module 200, the nonvolatile selection elements 219 within the group selectors 210 may be programmed.

The nonvolatile selection elements 219 define which repair modules 300 respond to an asserted shared address bit 152 and which repair modules 300 respond to a de-asserted shared address bit 152. As example embodiments, FIGS. 2 and 3 show A0 as the shared address bit 152. In these embodiments, the group selectors 210 may be thought of as defining which repair modules 300 may be selected to respond to an even address (i.e., A0 is de-asserted) and which repair modules 300 may be selected to respond to an odd address (i.e., A0 is asserted). A different address bit may be selected as the shared address bit 152 in practicing the present invention. For example, if the most significant address bit is selected, the group selectors 210 may define which repair modules 300 may respond to an address in the lower half of a memory block and which repair modules 300 may respond to an address in the upper half of a memory block.

As an operational example for the embodiment shown in FIG. 2 if, after testing the semiconductor memory 100, six column addresses are determined to produce incorrect results, the six defective columns may be replaced by six redundant columns. Each of the six defective columns has a unique address comprised of nine bits (i.e., A0–A8). Nine bits are used as an example, other numbers of address bits are possible and within the scope of the present invention. After examining the six unique addresses, it is determined that three addresses are even, and three addresses are odd. Using this determination, the nonvolatile selection elements 219 in the group selection modules may be programmed such that the repair modules 300 connected to the group selector 210 respond to an even or odd address. In the case of three even addresses, one group module connected to a pair of repair modules 300 is programmed and one group module connected to a single repair module 300 is programmed. For example, nonvolatile selection elements 219 FZSa and FZPa may be programmed to assert the corresponding selection inputs 310 to repair modules 300 zero, two and three for all even addresses. In addition, to enable repair modules 300 zero, two, and three so that they may generate a match output 360 each of the nonvolatile enable elements 332 within those repair modules 300 may be programmed. All group selection modules, wherein the nonvolatile selection element 219 is not programmed, will generate an asserted selection input 310 for odd addresses. However, only three odd addresses are required. Therefore, the nonvolatile enable elements 332 may be programmed for two of the repair modules 300 connected to one of the remaining group modules controlling a pair of repair modules 300 and one of the repair modules 300 connected to a group module controlling only that single repair module 300. For example, nonvolatile enable elements 332 in repair modules 300 one, four, and five may be programmed. After this programming, repair modules 300 six and seven are disabled from generating a match output 360 because their nonvolatile enable elements 332 are not programmed. Repair modules zero, two, and three are enabled and may generate a match output 360 for any even address. Finally, repair modules 300 one, four, and five are enabled and may generate a match output 360 for any odd address.

To complete the programming of the redundancy selection module 200, each enabled repair module 300 may be programmed to respond to a selected address 315 for that repair module 300. In the present example, repair modules 300 zero through five may be programmed. Each enabled repair module 300 may generate a match output 360 only for its unique nine-bit selected address 315. For example, assume repair module 300 two is programmed to respond to an address input 150 of 32 decimal (0 0001 0000 binary). The address comparison on A1–A8 may generate a match for address inputs 150 values of 32 and 33 since the only difference between 32 and 33 is bit A0. However, since the selection input 310 may only be asserted for an even address (i.e., A0 is de-asserted), an address input 150 of 32 may generate a match output 360 while an address input 150 of 33 may not generate a match output 360. Note that the selection input 310 for repair module 300 three is the same as that for repair module 300 two. However, repair module 300 three would be programmed to a different selected address 315, and, as a result, even though the selection input 310 to repair module 300 three may be asserted, the match output 360 would not be asserted.

It will be readily apparent to a person skilled in the art that any combination of even and odd address inputs 150 to the repair modules 300 may be supported with the embodiment shown in FIG. 2. Support of full reparability relative to the prior art is the reason that the two group selectors 210 connected to a single repair module 300 are provided. These two group selectors 210 allow for an odd number of even addresses and an odd number of odd addresses (e.g., three even addresses and five odd addresses). However, if some reparability may be sacrificed the two group selectors 210 connected to a single repair module 300 may be replaced by a group selector 210 connected to a pair of repair modules 300. This eliminates only the combination of an odd number of even addresses and an odd number of odd addresses (e.g., three even addresses five odd addresses) when all the repair modules 300 within a redundancy selection module 200 are used. The combination of an even number of even addresses and an even number of odd addresses (e.g., two even addresses and six odd addresses) using all repair modules 300 may still be supported, as well as any combination not using all repair modules 300 in a redundancy selection module 200.

As an operational example for the embodiment shown in FIG. 3 if, after testing the semiconductor memory, 13 column addresses are determined to produce incorrect results, the 13 defective columns may be replaced by 13 redundant columns. Each of the 13 defective columns has a unique address comprised of eight bits (i.e., A0–A7). Once again, eight bits are used as an example, other numbers of address bits are possible and within the scope of the present invention. After examining the 13 unique addresses, it is determined that ten addresses are even and three addresses are odd. Using this determination, the nonvolatile selection elements 219 in the group selection modules may be programmed such that the repair modules 300 connected to the group selector 210 respond to an even or odd address. In the case of ten even addresses, nonvolatile selection element 219 FZ3 in the group module connected to eight repair modules 300 is programmed and nonvolatile selection element 219 FZ1 in the group module connected to two repair modules 300 is programmed. In addition, so that they may generate a match output 360, each of the nonvolatile enable elements 332 within enable of repair modules 300 two, three, and eight through fifteen, are programmed. All group selection modules, wherein the nonvolatile selection element 219 is not programmed, will generate an asserted selection input 310 for odd addresses. However, only three odd addresses are required. Therefore, the nonvolatile enable elements 332 may be programmed for repair modules 300 four, five, and six connected to the group selector 210 containing the un-programmed nonvolatile selection element 219 FZ2. After this programming, repair modules 300 zero, one, and seven are disabled from generating a match output 360 because their nonvolatile enable elements 332 are not programmed. Repair modules two, three, and eight through fifteen are enabled and may generate a match output 360 for any even address. Finally, repair modules 300 four, five, and six are enabled and may generate a match output 360 for any odd address.

To complete the programming of the redundancy selection module 200', each enabled repair module 300 may be programmed to respond to a selected address 315 for that repair module 300. In the present example, repair modules 300 two through six and eight through fifteen may be programmed. Each enabled repair module 300 may generate a match output 360 only for its unique eight-bit selected address 315. For example, assume repair module 300 six is programmed to respond to an address input 150 of 33 decimal (0001 0001 binary). The address comparison on A1–A7 may generate a match for address input 150 values of 32 and 33 since the only difference between 32 and 33 is bit A0. However, because the selection input 310 may only be asserted for an odd address (i.e. A0 is asserted), an address input 150 of 33 may generate a match output 360 while an address input 150 of 32 may not generate a match output 360. Note that the selection input 310 for repair module 300 six is the same as that for repair modules 300 four, five and seven. However, selection modules four and five would be programmed to a different selected address 315, and, as a result, even though the selection input 310 to repair module 300 four and five may be asserted, the match output 360 would not be asserted. Additionally, repair module 300 seven has not been enabled so it will not generate a match output 360. It will be obvious to a person skilled in the art that any combination of even and odd address inputs 150 to the repair modules 300 may be supported with the embodiment shown in FIG. 3.

In the embodiments of the redundancy selection module (200 and 200') shown in FIGS. 2 and 3 respectively, the shared address bit 152 is defined as A0. However, any of the bits within the address input 150 bus may be used as the shared address bit 152. In fact, it may be advantageous to use a different address input 150 bit as the shared address bit 152 within each redundancy selection module 200 or 200'. There is reduced loading on the shared address bit 152 for the same reasons discussed for the reduction in number of nonvolatile elements, namely, the shared address bit 152 connects to a fewer number of group selectors 210 relative to connecting to every repair module 300. Reduced loading may typically increase signal speed. By using different address bits for different redundancy selection modules 200 it may be possible to increase the speed of the overall address input 150 bus.

Figure 5:
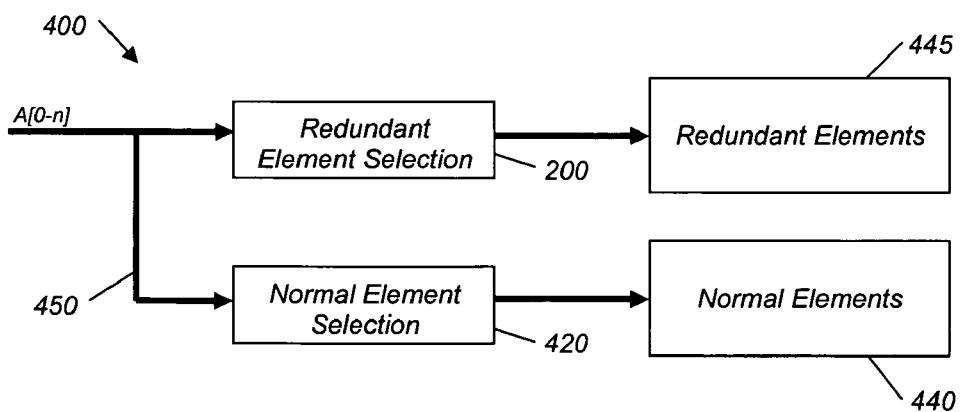
FIG. 5 is a block diagram of a repair apparatus according to another exemplary embodiment of the invention.

Embodiments of the present invention have been described in relation to semiconductor memories including redundant memory cells. However, the present invention is applicable as a repair apparatus 400 in other systems and devices where a reduced number of programmable elements are desired. FIG. 5 illustrates a repair apparatus 400 according to another exemplary embodiment of the invention. The repair apparatus 400 includes normal elements 440, redundant elements 445 a normal selection module 420, a redundant selection module 200, and an address input bus 450. In the FIG. 5 embodiment, redundant elements may include memory rows, memory columns, memory arrays, register files, execution units, and processors.

As examples, in fault tolerant systems containing redundant processors, the present invention may be used to disable certain processors from operation or participation in a voting process. Alternatively, the present invention may be used to select redundant processors in place of normal processors. In another example, processors may contain normal execution units and redundant execution units, such as arithmetic logic units and the like. The present invention may select redundant execution units to replace faulty execution units. Similarly, a processor may contain redundant register files to replace faulty register files. Moreover, the term faulty may be defined as producing a desired result too slowly, rather than incorrectly. As a result, it may be desirable to select redundant elements, such as, for example, execution units or redundant register files, which may operate faster than normal execution units or normal register files operate.

Figure 6:
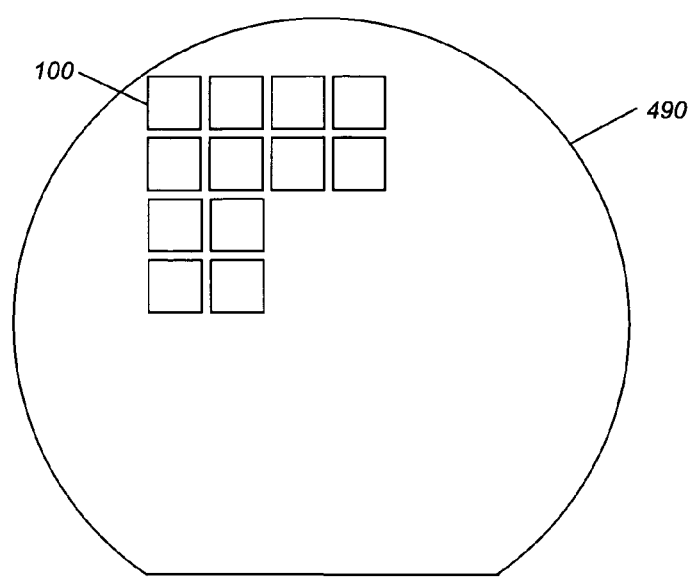
FIG. 6 is a semiconductor wafer including a plurality of semiconductor memories containing including selection modules.

As shown in FIG. 6, a semiconductor wafer 490, in accordance with the present invention, includes a plurality of semiconductor memories 100 incorporating the reduced fuse architecture described herein. Of course, it should be understood that the semiconductor memories 100 may be fabricated on substrates other than a silicon wafer, such as, for example, a Silicon On Insulator (SOI) substrate, a Silicon On Glass (SOG) substrate, and a Silicon On Sapphire (SOS) substrate.

Figure 7:
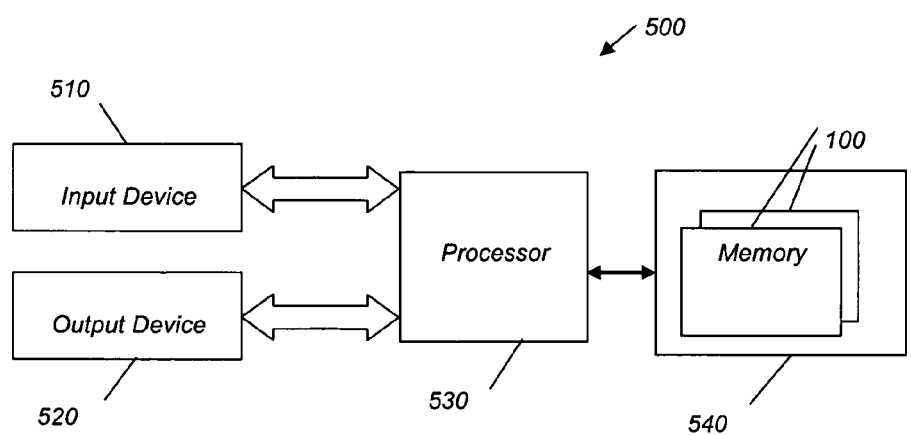
FIG. 7 is a computing system diagram showing a plurality of semiconductor memories redundancy selection modules.

As shown in FIG. 7, an electronic system 500, in accordance with the present invention, comprises an input device 510, an output device 520, a processor 530, and a memory device 540. The memory device 540 comprises at least one semiconductor memory 100 incorporating the reduced fuse architecture described herein in a DRAM device. It should be understood that the semiconductor memory 100 might comprise a wide variety of devices other than a DRAM, including, for example, Static RAM (SRAM) devices, and Flash memory devices 540.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A semiconductor device including a plurality of redundant elements, comprising:
    a plurality of repair modules operably coupled to the plurality of redundant elements, each of the plurality of repair modules comprising:
        a selection input; and
        a match output operably coupled to one of the plurality of redundant elements, wherein each of the plurality of repair modules may be configured to assert the match output if the selection input is asserted and select the one of the plurality of redundant elements;
    at least one shared address bit; and
    a plurality of group selectors operably coupled to the selection inputs of a group of repair modules wherein the plurality of group selectors may be configured to assert the selection inputs of the group of repair modules if the at least one shared address bit is in a designated state.

2. The semiconductor device of claim 1, wherein the designated state is asserted.

3. The semiconductor device of claim 1, wherein the designated state is de-asserted.

4. The semiconductor device of claim 1, wherein each of the plurality of group selectors select a pair of repair modules and may be configured by programming a nonvolatile selection element.

5. The semiconductor device of claim 4, wherein the plurality of group selectors further comprises a first additional group selector operably coupled to the selection input of a first additional repair module.

6. The semiconductor device of claim 5, wherein the plurality of group selectors further comprises a second additional group selector operably coupled to the selection input of a second additional repair module.

7. The semiconductor device of claim 4, wherein the nonvolatile selection elements are selected from the group consisting of fuses, anti-fuses, laser fuses, Flash memory cells, and EPROM cells.

8. The semiconductor device of claim 1, wherein each of the plurality of group selectors are consecutively numbered with a number N, starting at zero, wherein each of the plurality of group selectors is operably coupled to the selection inputs of $2^N$ repair modules and may be configured by programming a nonvolatile selection element.

9. The semiconductor device of claim 8, wherein the plurality of group selectors further comprises a first additional group selector operably coupled to the selection input of a first additional repair module.

10. The semiconductor device of claim 8, wherein the nonvolatile selection elements are selected from the group consisting of fuses, anti-fuses, laser fuses, Flash memory cells, and EPROM cells.

11. The semiconductor device of claim 1, wherein each of the plurality of repair modules further comprises:
    a plurality of nonvolatile address elements configured for programming a selected address wherein the match output may be asserted if the selection input is asserted and an address input corresponds to the selected address.

12. The semiconductor device of claim 11, wherein the plurality of nonvolatile address elements are selected from the group consisting of fuses, anti-fuses, laser fuses, Flash memory cells, and EPROM cells.

13. The semiconductor device of claim 1, wherein each of the plurality of repair modules further comprises:
    a nonvolatile enable element configured for programming to enable the repair module; and a plurality of nonvolatile address elements configured for programming a selected address wherein the match output may be asserted if the selection input is asserted, an address input corresponds to the selected address, and the repair module is enabled.

14. The semiconductor device of claim 13, wherein the nonvolatile enable element and the plurality of nonvolatile address elements are selected from the group consisting of fuses, anti-fuses, laser fuses, Flash memory cells, and EPROM cells.

15. The semiconductor device of claim 1, wherein each of the plurality of repair modules further comprises:
a nonvolatile enable element configured for programming to enable the repair module;
a nonvolatile disable element configured for programming to disable the repair module; and
a plurality of nonvolatile address elements configured for programming a selected address wherein the match output may be asserted if the selection input is asserted, an address input corresponds to the selected address, the repair module is enabled, and the repair module is not disabled.

16. The semiconductor device of claim 15, wherein the nonvolatile enable element, the nonvolatile disable element, and the plurality of nonvolatile address elements are selected from the group consisting of fuses, anti-fuses, laser fuses, Flash memory cells, and EPROM cells.

17. The semiconductor device of claim 1, wherein the plurality of redundant elements are selected from the group consisting of memory rows, memory columns, memory arrays, register files, execution units, and processors.

18. A method of configuring a semiconductor device including a plurality of redundant elements, comprising;
defining at least one shared address bit;
configuring a plurality of group selectors to select a group of repair modules if the at least one shared address bit is asserted; and
configuring each of a plurality of repair modules with a selected address such that each repair module may select one of the plurality of redundant elements when an address input corresponds to the selected address for that repair module and the repair module is selected.

19. The method of claim 18, wherein the group of repair modules is a pair of modules.

20. The method of claim 19, further comprising configuring a first additional group selector to select a first additional repair module if the at least one shared address bit is asserted.

21. The method of claim 19, further comprising configuring a second additional group selector to select a second additional repair module if the at least one shared address bit is asserted.

22. The method of claim 18, wherein each of the plurality of group selectors are consecutively numbered with a number N, starting at zero, wherein each of the plurality of group selectors select $2^N$ repair modules.

23. The method of claim 22, further comprising configuring a first additional group selector to select a first additional repair module if the at least one shared address bit is asserted.

24. The method of claim 18, wherein configuring the plurality of group selectors comprises, programming a nonvolatile selection element.

25. The method of claim 18, wherein configuring each of a plurality of repair modules comprises, programming a plurality of nonvolatile address elements to a value representing the selected address.

26. The method of claim 18, further comprising programming a nonvolatile enable element corresponding to each of the plurality of repair modules, wherein each repair module is enabled when the nonvolatile enable element corresponding to that repair module of the plurality of repair modules is programmed.

27. The method of claim 18, further comprising programming a nonvolatile disable element corresponding to each of the plurality of repair modules, wherein each repair module is disabled when the nonvolatile disable element corresponding to that repair module is programmed.

28. A method of selecting at least one of a plurality of redundant elements on a semiconductor device, comprising:
selecting at least one group of repair modules if at least one shared address bit corresponds to a nonvolatile selection element;
enabling one of the at least one group of repair modules if an address input matches a selected address for the one repair module; and
selecting one of the plurality of redundant elements if the one redundant element corresponds to an enabled repair module.

29. A method, comprising:
generating a match for each of a plurality of redundant elements when an address input corresponds to a selected address for each of the plurality of redundant elements;
generating a selection for a group of the plurality of redundant elements when a shared address bit corresponds to a nonvolatile selection element; and
selecting one of the plurality of redundant elements if a match is generated and a selection is generated for the one redundant element.

30. A semiconductor wafer, comprising:
at least one semiconductor device including a plurality of redundant elements, comprising:
a plurality of repair modules operably coupled to the plurality of redundant elements, each repair module of the plurality of repair modules comprising:
a selection input; and
a match output operably coupled to one of the plurality of redundant elements wherein, each of the plurality of repair modules may be configured to assert the match output if the selection input is asserted, thereby selecting the one of the plurality of redundant elements;
at least one shared address bit; and
a plurality of group selectors operably coupled to the selection inputs of a group of repair modules wherein, the plurality of group selectors may be configured to assert the selection inputs of the group of repair modules if the at least one shared address bit is in a designated state.

31. An electronic system, comprising:
at least one input device;
at least one output device;
a processor; and
a memory device comprising, at least one semiconductor memory including a plurality of redundant elements, comprising:
a plurality of repair modules operably coupled to the plurality of redundant elements, each repair module of the plurality of repair modules comprising:
a selection input; and
a match output operably coupled to one of the plurality of redundant elements wherein, each of the plurality of repair modules may be configured to assert the match output if the selection input is asserted, thereby selecting the one of the plurality of redundant elements;
at least one shared address bit; and a plurality of group selectors operably coupled to the selection inputs of a group of repair modules wherein, the plurality of group selectors may be configured to assert the selection inputs of the group of repair modules if the at least one shared address bit is in a designated state.

* * * * *

UNITED STATES PATENT AND TRADEMARK OFFICE
CERTIFICATE OF CORRECTION

PATENT NO. : 7,006,393 B2　　　　　　　　　　　　　　　　　　　　Page 1 of 1
APPLICATION NO. : 10/862284
DATED : February 28, 2006
INVENTOR(S) : Todd A. Merritt, Timothy B. Cowles and Vikram K. Bollu It is certified that error appears in the above-identified patent and that said Letters Patent is hereby corrected as shown below:

In the specification:

| | | |
|---|---|---|
| COLUMN 1, | LINE 45, | change "address including" to --address, including-- |
| COLUMN 4, | LINE 24, | change "containing including" to --containing-- |
| COLUMN 4, | LINE 27, | change "memories redundancy" to --memories including redundancy-- |
| COLUMN 5, | LINE 21, | change "values such" to --values, such-- |
| COLUMN 6, | LINE 57, | change "configurations such" to --configurations, such-- |
| COLUMN 7, | LINE 30, | change "300 e.g.," to --300 (e.g.,-- |
| COLUMN 7, | LINE 59, | change "$2^{M+}-1$" to --$2^{M+1}-1$ -- |
| COLUMN 8, | LINE 25, | change "200) for" to --200') for-- |
| COLUMN 8, | LINE 54, | change "FIG. 2 if," to --FIG. 2, if,-- |
| COLUMN 10, | LINE 54, | change "output 360" to --output 360,-- |
| COLUMN 11, | LINE 19, | change "memories including" to --memories, including-- |

Signed and Sealed this

Twentieth Day of November, 2007

JON W. DUDAS
*Director of the United States Patent and Trademark Office*